(12) United States Patent
Gentry et al.

(10) Patent No.: US 8,671,376 B2
(45) Date of Patent: Mar. 11, 2014

(54) COMPUTER SYSTEM AND METHOD FOR PERFORMING A ROUTING SUPPLY AND DEMAND ANALYSIS DURING THE FLOOR PLANNING STAGE OF AN INTEGRATED CIRCUIT DESIGN PROCESS

(75) Inventors: Jason T. Gentry, Windsor, CO (US); Brady A. Koenig, Fort Collins, CO (US); Richard S. Rodgers, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/432,398

(22) Filed: Mar. 28, 2012

(65) Prior Publication Data

US 2013/0263073 A1     Oct. 3, 2013

(51) Int. Cl.
*G06F 17/50*     (2006.01)

(52) U.S. Cl.
USPC ............ 716/118; 716/110; 716/119; 716/139

(58) Field of Classification Search
USPC ........... 716/118, 139; 702/60, 64, 65; 703/13, 703/14, 17
See application file for complete search history.

(56) References Cited

U.S. PATENT DOCUMENTS

| | | | |
|---|---|---|---|
| 5,754,826 A | | 5/1998 | Gamal et al. |
| 6,360,350 B1 | | 3/2002 | Gabele et al. |
| 6,675,139 B1 * | | 1/2004 | Jetton et al. .................. 703/17 |
| 6,782,520 B1 | | 8/2004 | Igusa et al. |
| 7,016,794 B2 * | | 3/2006 | Schultz ........................... 702/64 |
| 8,028,266 B2 * | | 9/2011 | Ramsour et al. .............. 716/122 |
| 2006/0225016 A1 * | | 10/2006 | Fukasawa ........................ 716/10 |
| 2006/0294488 A1 * | | 12/2006 | Waller ............................ 716/13 |
| 2007/0250800 A1 * | | 10/2007 | Keswick ........................... 716/8 |
| 2009/0064066 A1 * | | 3/2009 | Kurihara et al. .................. 716/5 |
| 2009/0327990 A1 * | | 12/2009 | Waller ............................ 716/12 |
| 2010/0223587 A1 * | | 9/2010 | Huang et al. .................... 716/11 |
| 2011/0055786 A1 * | | 3/2011 | Gao .............................. 716/126 |

OTHER PUBLICATIONS

Ray Farbarik, Xiaowen Liu, Mark Rossman; CAD Tools for Area-Distributed I/O Pad Packaging; IEEE Multi-Chip Module Conference; Feb. 4-5, 1997; 125-129; IEEE; United States.
Faran Rafiq, Malgorzata Chrzanowska-Jeske, Hannah Honghua Yang, Marcin Jeske, Naveed Sherwani; Integrated Floorplanning with Buffer/Channel Insertion for Bus-Based Designs; IEEE Transactions on Computer-Aided Design of Integrated-Circuits and Systems; Jun. 2003; 730-741; vol. 22 No. 6; IEEE; United States.

* cited by examiner

*Primary Examiner* — Thuan Do
*Assistant Examiner* — Brian Ngo

(57) ABSTRACT

A floor planning tool is provided that performs the functions that are typically performed by floor planning tools, but in addition, determines the supply of routing resources and the demand on routing resources for all routing channels while applying variable routing rules and static timing estimations to arrive at a preliminary routed floor plan. This drastically reduces the number of iterations that subsequently will need to be performed by the floor planning tool and by routing and static timing analysis tools to arrive at a final routed floor plan.

31 Claims, 15 Drawing Sheets

Route Classes

| Name | Color | Route Rule | Min Layer | Max Layer | Max Dist(um) | %Ovrhd | Delete |
|---|---|---|---|---|---|---|---|
| default | hotpink | — | — | — | — | — | |
| 2xPitchDelay | hotpink | NDR_p10_p10 | 2 | 8 | 1300 | 20 | X |
| 3xPitchDelay | hotpink | NDR_p20_p10 | 2 | 8 | 2250 | 20 | X |
| 4xPitchDelay | hotpink | NDR_p27_p13 | 2 | 8 | | 20 | X |
| ThickMetal | hotpink | default | 9 | 10 | | 20 | X |
| OTB | hotpink | default | 9 | 10 | | 20 | X |

Add Route Class

FIG. 9

```
HCHAN (10111.2 3924.8 12355.2 4259.2) overutilized: 123.1 %, needs
additional 77.297
    1212 net(s) (route class: 2xPitchDelay (NDR_p10_p10))
        Source:      instF
        Destination: instV
    601 net(s) (route class: 2xPitchDelay (NDR_p10_p10))
        Source:      instE
        Destination: instV
    564 net(s) (route class: 2xPitchDelay (NDR_p10_p10))
        Source:      instM
        Destination: instV
    400 net(s) (route class: 2xPitchDelay (NDR_p10_p10))
        Source:      instD0
        Destination: instJ
    400 net(s) (route class: 2xPitchDelay (NDR_p10_p10))
        Source:      instD1
        Destination: instJ
```

COMPUTER SYSTEM AND METHOD FOR PERFORMING A ROUTING SUPPLY AND DEMAND ANALYSIS DURING THE FLOOR PLANNING STAGE OF AN INTEGRATED CIRCUIT DESIGN PROCESS

TECHNICAL FIELD OF THE INVENTION

The invention relates to designing integrated circuits (ICs). More particularly, the invention relates to a computer system and a method for performing a route supply and demand analysis during the floor planning stage of an IC design process.

BACKGROUND OF THE INVENTION

The process of designing an IC has several stages of planning and analysis. One of the planning stages is known as the floor planning stage, which is performed by a floor planning tool. The floor planning stage generally involves placement of the larger components of the design in a top-level floor plan followed by partitioning of the remaining logic into blocks. During the partitioning process, the floor planning tool analyzes a netlist containing a list of all of the logic gates and their connectivity and groups the logic gates into blocks in a way that minimizes the routing of the electrical conductors that interconnect the blocks. As part of the block partitioning process, the blocks are placed in the top-level floor plan such that blocks that communicate with each other are in closer proximity to one another than blocks that do not communicate with one another or that communicate with one another relatively infrequently.

After the floor planning process has been performed, the floor plan is sent to a routing tool that determines the electrically-conductive routes, or nets, needed to establish the necessary connectivity. During the routing process, the routing tool attempts to place all of the routes that interconnect any two blocks within a channel that corresponds to the shortest available path between the two blocks. The shortest available path is commonly referred to as the ideal path. Each channel comprises a portion of one or more metal layers that extend between the blocks. Each channel has a limited width and thickness, i.e., limited resources. If there are insufficient resources available in a channel for all of the routes that are needed, the routing tool will attempt to place the remaining routes in a channel that corresponds to the next shortest path between the two blocks. When the routing tool uses a path other than the ideal path, this is commonly referred to as meandering.

After the routing tool has performed the routing process, the routed floor plan is returned to the floor planning tool, which performs some route quality analyses to determine whether the routes meet certain physical constraints. If they do not, then the designer uses the floor planning tool to modify the floor plan. The modified floor plan is then sent back to the routing tool, which again generates a route plan. There may be several iterations of the floor planning and routing processes before a satisfactory routed floor plan has been achieved.

Once a satisfactory routed floor plan has been achieved, the IC design process moves to a resistor capacitor (RC) extraction stage during which an RC extraction tool extracts the parasitic values of the IC design. After the RC extraction stage has been completed, the IC design process moves to a static timing analysis stage during which a static timing analysis tool analyzes the design and determines whether the design meets static timing performance criteria. In many cases, meandering-induced timing failures are detected during the static timing analysis stage, resulting in the design being returned to the floor planning stage for modification of the floor plan. After the floor plan has been modified, the design is again returned to the routing tool, which modifies the routes based on the modified floor plan. The design is then returned to the RC extraction stage followed by the static timing analysis stage.

FIGS. 1 and 2 are pictorial diagrams that demonstrate all of the aforementioned stages, the amount of time that is typically required for each stage, and the iterations that often occur between the various stages. As shown in FIG. 1, the floor planning stage typically takes about one to two days and the routing stage typically takes four to seven days. Thus, a single iteration of the floor planning and routing processes typically takes about five to nine days. As shown in FIG. 2, the RC extraction stage typically takes about two to three days and the static timing analysis stage typically takes about four to five days. Thus, a single iteration of the floor planning, routing, RC extraction, and static timing analysis processes typically takes about 11 to 15 days.

If multiple iterations of the loop shown in FIG. 1 or of the larger loop shown in FIG. 2 have to be performed, several weeks or months can be consumed to arrive at the final routed floor plan. There are typically multiple iterations of both loops before the final routed floor plan is achieved, which can result in schedule delays and missed deadlines. In addition, because die sizes are typically set before the complete analysis has been performed, resources may be over estimated or under estimated, resulting in wasted die area or unexpected die size growth, both of which lead to increased costs.

One alternative to performing all of these iterations would be to calculate the routing by hand to make sure that the design will meet static timing constraints, but this process would also be very time consuming and is prone to human error. It is known to place "bus guides" at locations in the design during the floor planning stage to define channels for certain routes. Bus guides are often used to force timing-critical buses to be routed over channels that have the most resources. Using bus guides for this purpose is advantageous, but the designer must have knowledge of where to place them and which channels have excess resources, which the designer may not always possess.

Accordingly, a need exists for a solution that reduces the number of iterations that need to be performed in order to arrive at a final routed floor plan.

SUMMARY OF THE INVENTION

The invention is directed to a computer system, method, and computer program for designing a floor plan of an IC design to include a preliminary route plan. The computer system comprises a user interface, a memory subsystem, and a processor subsystem. The memory subsystem stores a representation of at least a portion of the IC design and computer code for designing a floor plan. The processor subsystem is programmed to: generate a floor plan having multiple blocks of logic and channels comprising portions of one or more layers of metal extending between the blocks; determine a supply of routing resources that is available for one or more selected channels of the floor plan for routing electrical signals over the selected channels between the blocks; generate a preliminary route plan in the floor plan for the selected channels based on the supply of available routing resources; determine a demand on routing resources for each respective selected channel based on the preliminary route plan; and determine whether or not the demand on routing resources for each respective selected channel exceeds the supply of routing resources for each respective selected channel.

The method comprises: in a memory subsystem of the computer system, storing a representation of at least a portion of the IC design and computer code for designing a floor plan; and, in a processor subsystem of the computer system: generating a floor plan having multiple blocks of logic and channels comprising portions of one or more layers of metal extending between the blocks; determining a supply of routing resources that is available for one or more selected channels for routing electrical signals in the channels between the blocks; generating a preliminary route plan in the floor plan based on the supply of available routing resources for the selected channels; determining a demand on routing resources for each respective selected channel based on the preliminary route plan; and determining whether or not the demand on routing resources for each respective selected channel exceeds the supply of routing resources for each respective selected channel.

The computer program comprises computer instructions for: generating a floor plan having multiple blocks of logic and channels comprising portions of one or more layers of metal extending between the blocks; determining a supply of routing resources that is available for one or more selected channels for routing electrical signals in the selected channels between the blocks; generating a preliminary route plan in the floor plan based on the supply of available routing resources; determining a demand on routing resources for each respective selected channel based on the preliminary route plan; and determining whether or not the demand on routing resources for each respective selected channel exceeds the supply of routing resources for each respective selected channel.

These and other features and advantages of the invention will become apparent from the following description, drawings and claims.

BRIEF DESCRIPTION OF THE DRAWINGS

FIGS. 7-11 illustrate various components of the route planner screen shown in FIG. 5 and demonstrate the manner in which those components may be used to create and/or modify the floor plan shown in FIG. 6.

FIG. 14 illustrates a text report that is displayed on the display device of the computer system shown in FIG. 3 when the user makes an appropriate selection on the route planner screen shown in FIGS. 5 and 8 and then selects one of the channels of the preliminary routed floor plan shown in FIG. 13.

DETAILED DESCRIPTION OF AN ILLUSTRATIVE EMBODIMENT

Figure 1:
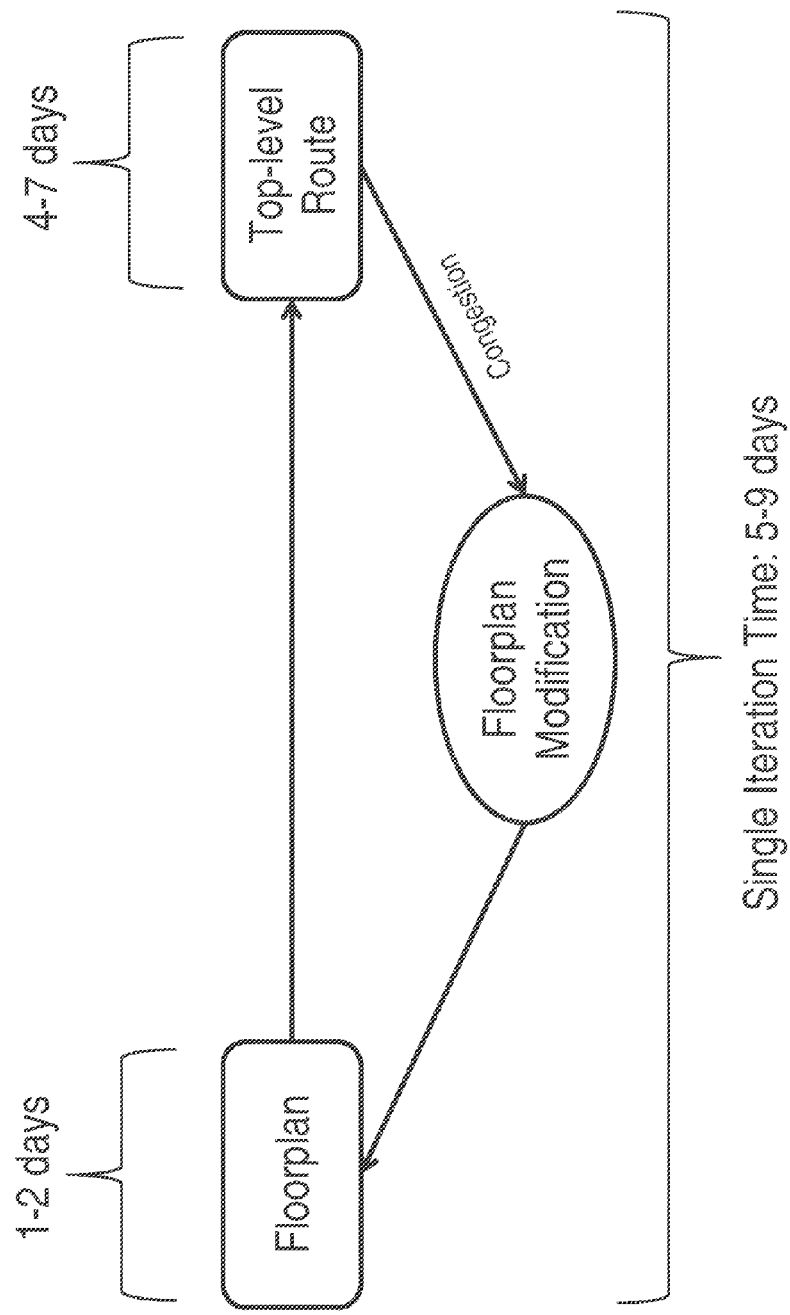
FIG. 1 illustrates a pictorial diagram that demonstrates the floor planning stage and the routing stage and the amount of time that is typically required for each stage.
Figure 2:
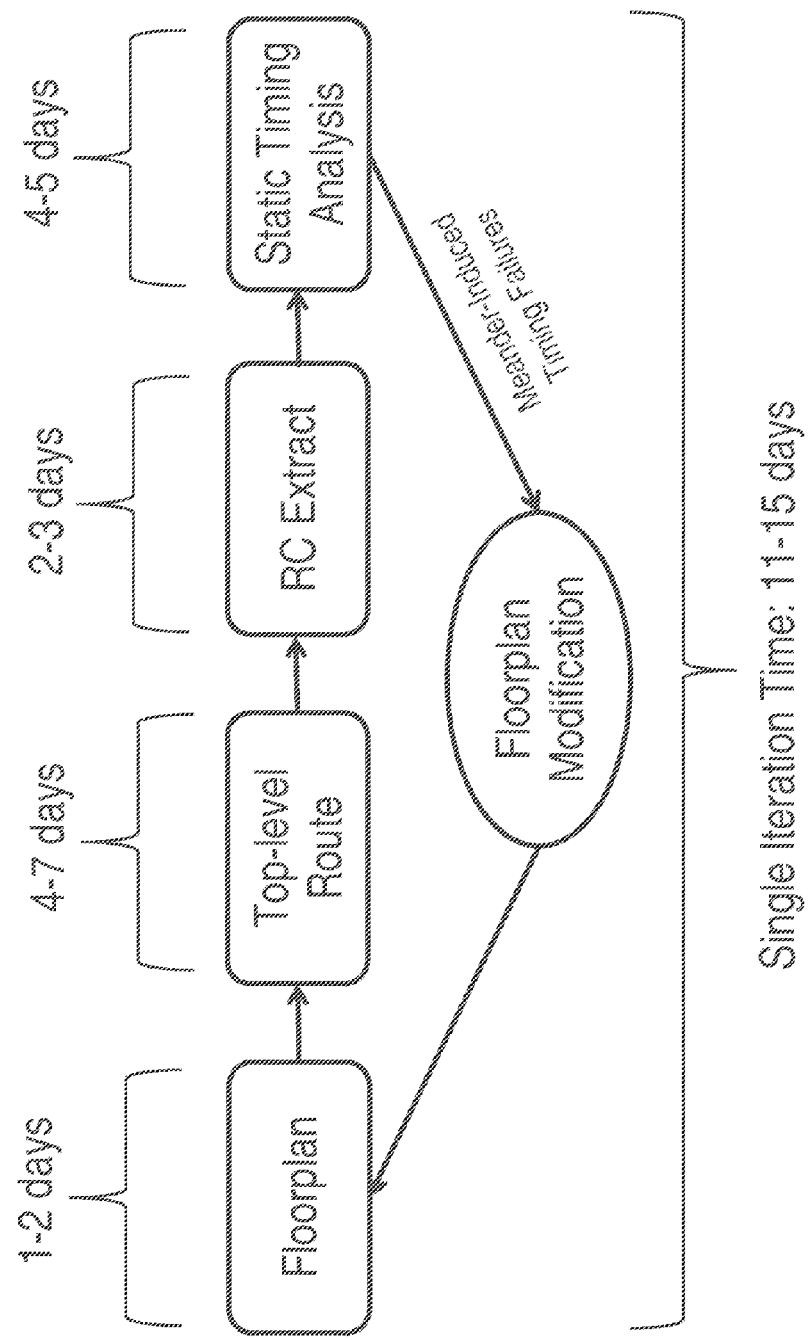
FIG. 2 illustrates a pictorial diagram that demonstrates the floor planning stage, the routing stage, the RC extraction stage, and the static timing analysis stage, as well as the amount of time that is typically required for each stage.

In accordance with illustrative, or exemplary, embodiments described herein, a floor planning tool is provided that performs the functions that are typically performed by floor planning tools, but in addition, determines the supply of routing resources and the demand on routing resources for all routing channels while applying variable routing rules and static timing estimations to arrive at a preliminary routed floor plan. This drastically reduces the number of iterations that will subsequently need to be performed by the floor planning tool and other external tools, such as routing, RC extraction, and static timing analysis tools, to arrive at a final routed floor plan.

The floor planning tool of the invention comprises a computer system programmed to perform the floor planning process of the invention. Typically, the floor planning process of the invention will be implemented as a set of procedures in Tool Command Language (TCL), which is a well known scripting language. The floor planning tool performs the floor planning and block partitioning processes in the known manner. After the block partitioning process has been performed, the floor planning tool determines the supply of routing resources that is available for each routing channel, which will be displayed to the user on a display device of a graphical user interface (GUI). Using the GUI, the user interacts with the floor planning tool to generate a preliminary route plan based on the available routing resources. Then, based on the preliminary route plan, the floor planning tool determines, for all channels, whether the routing demands can be accommodated by the supply of available routing resources and displays the results to the user on the display device of the GUI. The user may then continue to interact with the floor planning tool via the GUI to modify the route plan and/or the floor plan until a preliminary routed floor plan has been achieved.

The combination of all of these features allows a preliminary routed floor plan to be obtained during the floor planning stage that reduces the number of iterations that will need to be performed in subsequent stages by routing, RC extraction and static timing estimation tools. Reducing the number of iterations, in turn, results in fewer delays during the IC design process, more efficient use of die area in the IC design, and an overall reduction in the costs associated with designing the IC. Illustrative embodiments of the invention will now be described with reference to FIGS. 3-16, in which like reference numerals represent like features, elements or components.

Figure 3:
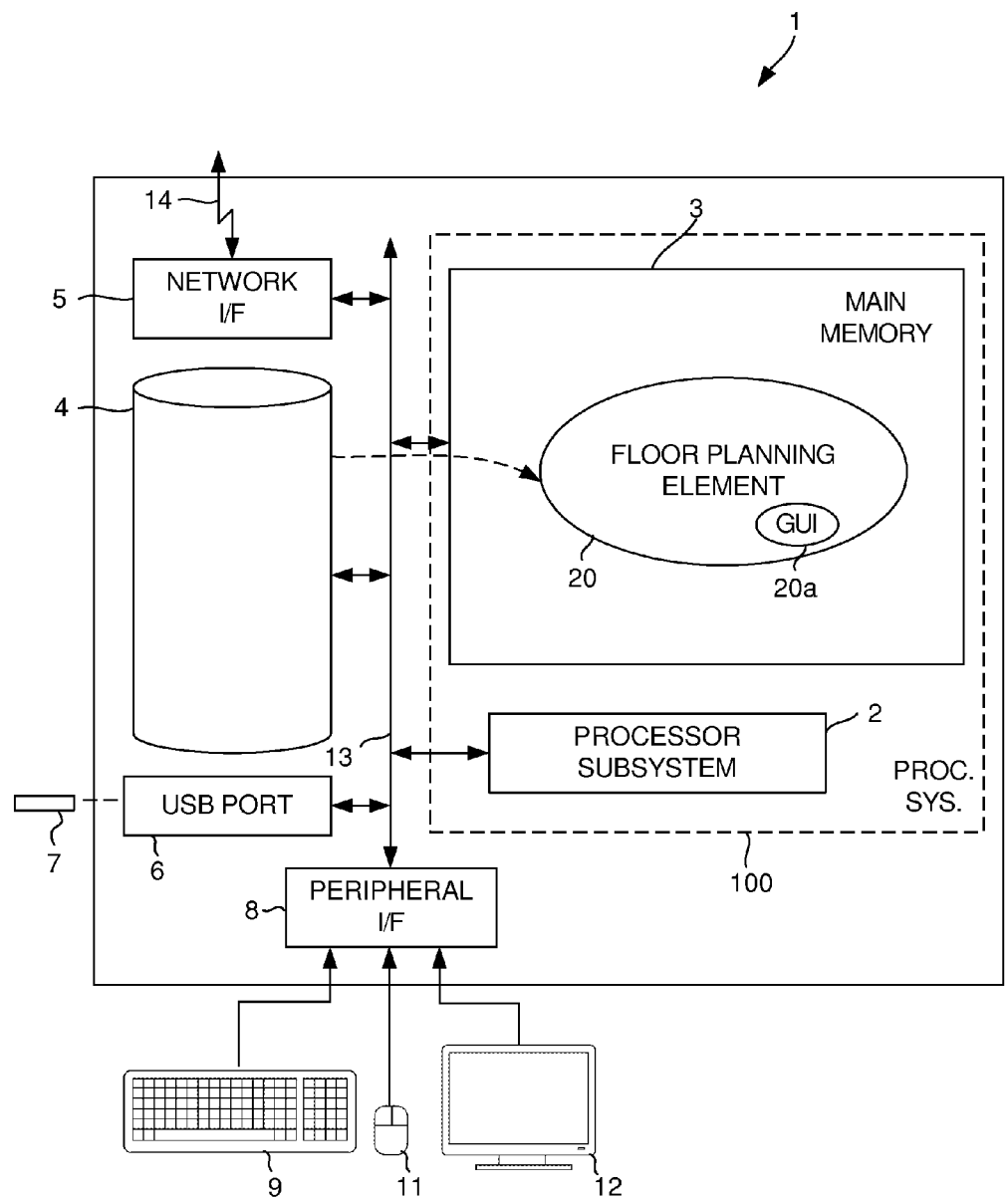
FIG. 3 illustrates a block diagram that represents the computer system for performing the floor planning process in accordance with an illustrative embodiment.

Prior to describing features of the floor planning tool, a computer system that may be used to implement the floor planning tool will be described with reference to FIG. 3. FIG. 3 is a block diagram that represents the computer system 1 for performing the floor planning process in accordance with an illustrative embodiment. The computer system 1 may be a workstation or personal computer system that has been suitably programmed or otherwise configured, as described below in more detail. The computer system 1 may be, for example, any computer system of a type commonly used to create a floor plan for an IC design. Except for the software elements described below that perform the floor planning process of the invention, the computer system 1 may have a conventional structure and configuration. Accordingly, the computer system 1 includes hardware and software elements of the types commonly included in such computer systems, such as a processor subsystem 2, a memory subsystem 3, non-volatile data storage 4 (e.g., a hard disk drive, Flash memory, etc.), a network interface 5, and one or more ports 6 for reading from and writing to external devices. Such external devices may include, for example, a removable data storage medium 7, such as a Universal Serial Bus (USB) "thumb drive."

The computer system 1 also includes a peripheral interface 8 through which data communication with a keyboard 9, a mouse 11 and a display device 12 can occur. The graphic interactive screens of the GUI of the invention are displayed on the display device 12. The user interacts with the GUI via the keyboard 9, the mouse 11, and/or other input devices.

Peripheral interface 8 may comprise USB ports of the same type as port 6 or any other suitable types of ports. In other embodiments, the computer system 1 may include hardware and software elements in addition to those described herein or that are different from those described herein. The above-described elements are in communication with one another via a digital bus 13. Computer system 1 is capable of communicating with remote devices (not shown) via a network connection 14, such as a connection to the Internet, a local area network (LAN), or a wide area network (WAN), for example.

Memory subsystem 3 is generally of a type in which software elements, such as data and computer code, are operated upon by the processor subsystem 2. In accordance with conventional computing principles, the processor subsystem 2 operates in accordance with programming code, such as operating system code and application program code. In the exemplary embodiment of the invention, such application program code includes a floor planning element 20. Although only this software element is conceptually shown for purposes of illustration as stored in or residing in memory subsystem 3, persons skilled in the art will appreciate that such a software element may not always reside in its entirety in memory subsystem 3, but rather, may be retrieved in portions on an as-needed basis, e.g., in code segments, files, modules, objects, data structures, instruction-by-instruction, or any other suitable basis, from data storage 4 or from some other suitable source (e.g., via network connection 14).

It should be noted that although only the floor planning element 20 is shown for purposes of clarity, other software elements of the type conventionally included in computer systems that enable them to operate properly are generally included in the computer system 1, such as operating system code and application code. It should also be noted that the software element and data used by the computer system 1 may be stored at a location that is external to the computer system 1 and accessible thereby via the network connection 14, such as in a memory element located in a network "cloud."

The combination of the processor subsystem 2, the memory subsystem 3 (or other element or elements in which software is stored or resides) and any related elements generally defines a programmed processor system 100 to which the other elements of computer system 1 are peripheral. It should also be noted that the combination of software elements and the non-transitory medium on which they are stored or in which they reside (e.g., memory subsystem 3, data storage 4, removable data storage medium 7, etc.) generally constitutes what is referred to in the patent lexicon as a "computer program product," or a "computer program article of manufacture."

In the exemplary embodiment, the floor planning process is a computer-implemented method that may be initiated by a person (user) who operates computer system 1. A user may operate computer system 1 locally using keyboard 9, mouse 11, display device 12, etc., or it can be operated remotely via network connection 14. In operation, and in accordance with the effects of software elements that include the floor planning element 20, the user interacts with the computer system 1 via the aforementioned GUI, which includes the keyboard 9, the mouse 11 and the display device 12. The keyboard 9, the mouse 11, the display device 12, the processor system 100, and a portion 20a of the floor planning element 20 that controls the interactions between the floor planning element 20, the mouse 11, the keyboard 9, and the display device 12 will be referred to herein collectively as the GUI. It should be noted that the GUI may include additional or alternative input devices to the keyboard 9 and mouse 11, such as a stylus pen, for example.

Prior to describing the graphical illustrations that are displayed on the display device 12 of the GUI and the interactions between the GUI and the user, the functional elements of the floor planning element 20 will be described with reference to FIG. 4. After the functional elements of the floor planning element 20 have been described, the graphical illustrations that are displayed on the display device 12 and the interactions between the GUI and the user that occur to create a routed floor plan will be described with reference to FIGS. 5-16.

Figure 4:
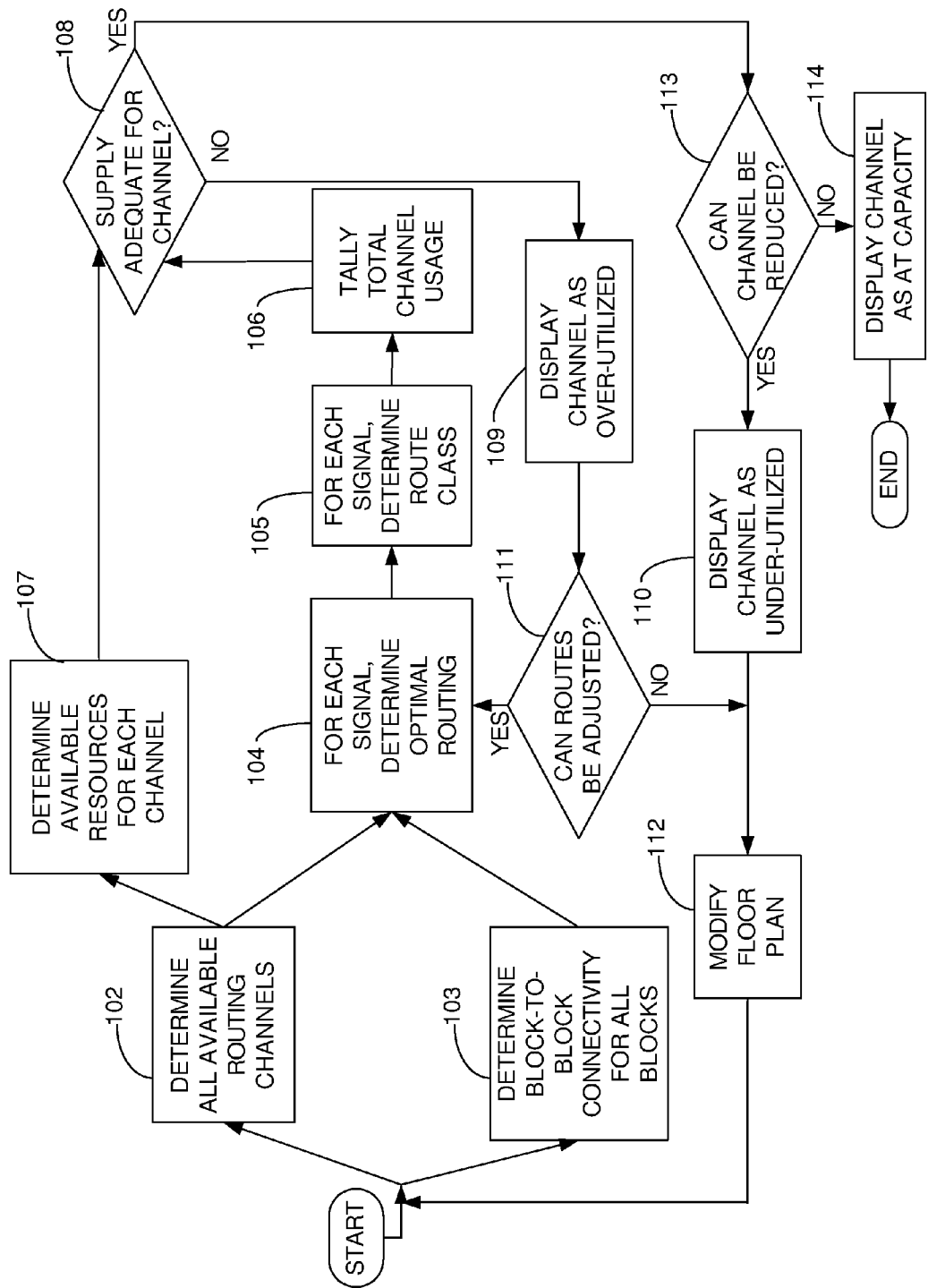
FIG. 4 illustrates a flowchart that represents the floor planning process in accordance with an illustrative embodiment.

FIG. 4 illustrates a flowchart that represents the functionality of the floor planning element 20 in accordance with an illustrative embodiment. At the beginning of the process represented by the flowchart, an initial floor plan has already been created using well known processes. In the interest of brevity, the known steps that are involved in creating the initial floor plan are not shown in FIG. 4. After the initial floor plan has been created, the floor planning element 20 determines all of the routing channels that are available in the top-level design, as indicated by block 102. In parallel with the process represented by block 102, the floor planning element 20 determines the block-to-block connectivity for all of the blocks in the top-level design, as indicated by block 103. During the process represented by block 103, all of the electrical interconnections between all of the blocks are determined, although the actual routes that will be used to make the interconnections have not yet been determined at this point in the process.

After the block-to-block connectivity and the electrical interconnections between the blocks have been determined, this information is received by the process represented by block 104. The process represented by block 104 processes this information to determine the optimal routing path for each inter-block signal. In determining each optimal path, the distance corresponding to each optimal path is obtained. There are known timing constraints that define the time delay per unit distance for the paths that make up the routes. The maximum propagation delay that is allowed between the instant in time when a signal leaves a source block and the instant in time when the signal must be received by a destination block is also known. Using all of this information, the process represented by block 105 determines the route class that will be used for each signal.

A route class defines a type of conductor configuration that can be used for a route to achieve a particular speed for the signal to ensure that it meets timing constraints. A thicker and wider conductor has less of a propagation delay than a thinner and narrower conductor. Each class defines a conductor having a particular thickness and width. In some cases, a particular class may use multiple conductors to achieve an even higher propagation speed. The route classes that are used in IC design processes are known in the art and may vary from manufacturer to manufacturer. Therefore, in the interest of brevity, a detailed description of the route classes will not be provided herein.

Having determined the optimal route path and the route class for each signal for each channel, the process represented by block 106 tallies the total channel usage for each channel. For each channel, this tally represents the demand on routing resources of the channel. In parallel with the process represented by block 104, the process represented by block 107 uses the information obtained by the process represented by block 102 to determine the total resources that are available for each channel. The total resources that are available for each channel correspond to the supply of resources for that channel.

Having determined the demand on resources for each channel and the supply of resources for each channel, the process represented by block 108 determines, for each channel, whether or not the supply of resources is capable of accommodating the demand for resources for that channel. If not, then the GUI graphically illustrates on the display device 12 that the channel is over-utilized, as indicated by block 109. In accordance with this illustrative embodiment, a channel is graphically illustrated as being over-utilized by displaying it in red color in the floor plan being displayed on the display device 12. Coloring the channel in this manner allows the user to quickly and easily ascertain that a channel is over-utilized.

For each channel that is over-utilized, the process represented by block 111 determines whether the routes of the channel can be adjusted. This process involves analyzing all of the routes of a given channel to determine whether the route distances or route classes can be adjusted in a way that makes resources available to other routes of the channel while still meeting timing constraints. If so, the processes represented by blocks 104 and 105 choose other routes and/or other route classes for one or more of the signals of the channel while ensuring that the chosen routes and/or route classes continue to meet timing constraints for each of the signals of the channel. The process then returns to block 106 where the demand on resources is again tallied. The process then returns to block 108 where the demand on resources for the channel is compared to the supply of available resources for the channel to determine whether the supply is adequate for the demand.

If it is determined at block 111 that the routes for an over-utilized channel cannot be adjusted, then the floor plan is modified, as indicated by block 112. The process of modifying a floor plan is the same as the process that is currently performed by IC designers using known floor planning tools. It may involve relocating one or more blocks in the top-level floor plan in a way that is believed to lead to an improved routing plan. The manner in which a floor plan may be modified to achieve this goal is well known in the art. It is possible that the determination represented by block 111 will be answered in the negative for a few reasons. For example, the timing constraints for multiple signals of the path may require that a route class corresponding to a double-wide conductor configuration be used for the signals in order to meet timing constraints, which would leave fewer metal-layer resources available in the channel to be used for other signals. As another example, if the metal that is used for the channel is relatively narrow and the number of signals that need to be routed over the channel is relatively large, it is possible that a high-speed signal that needs a double-wide conductor configuration in order to meet timing constraints cannot be accommodated. In such cases, the floor plan is modified as opposed to just adjusting only the routes for that particular channel.

If it is determined at block 108 that a channel is not over-utilized, then the process proceeds to block 113 where a determination is made as to whether the channel is under-utilized or whether it is at capacity. Because the channel is not over-utilized, it must either be at capacity or under-utilized. If the channel is at capacity, then it cannot be reduced, in which case the process proceeds to block 114 where a visual indication is displayed on the display device to indicate that the channel is at capacity. In accordance with an illustrative embodiment, at-capacity channels are displayed in the color yellow to allow the user to easily identify them visually.

If it is determined at block 113 that the channel is under-utilized, then the process proceeds to block 110 where a visual indication is displayed on the display device 12 that the channel is under-utilized. In accordance with the illustrative embodiment, under-utilized channels are displayed in the color green in the floor plan displayed on the display device 12 to allow the user to easily identify under-utilized channels visually. The process then proceeds to block 112 where the floor plan is modified by the user to reduce the under-utilized channel so that the routing resources that are not needed by the channel are made available to increase the supply of routing resources that are available for other channels.

Many modifications to the process represented by the flowchart of FIG. 4 are possible. For example, the process could simply end if it is determined at block 108 that the supply is adequate, rather than proceeding to block 113. In that case, the processes represented by blocks 110, 113 and 114 could be eliminated. Including those processes, however, helps ensure that the resulting routed floor plan is efficient in terms of the amount of routing resources and die area that are used in the design.

Figure 5:
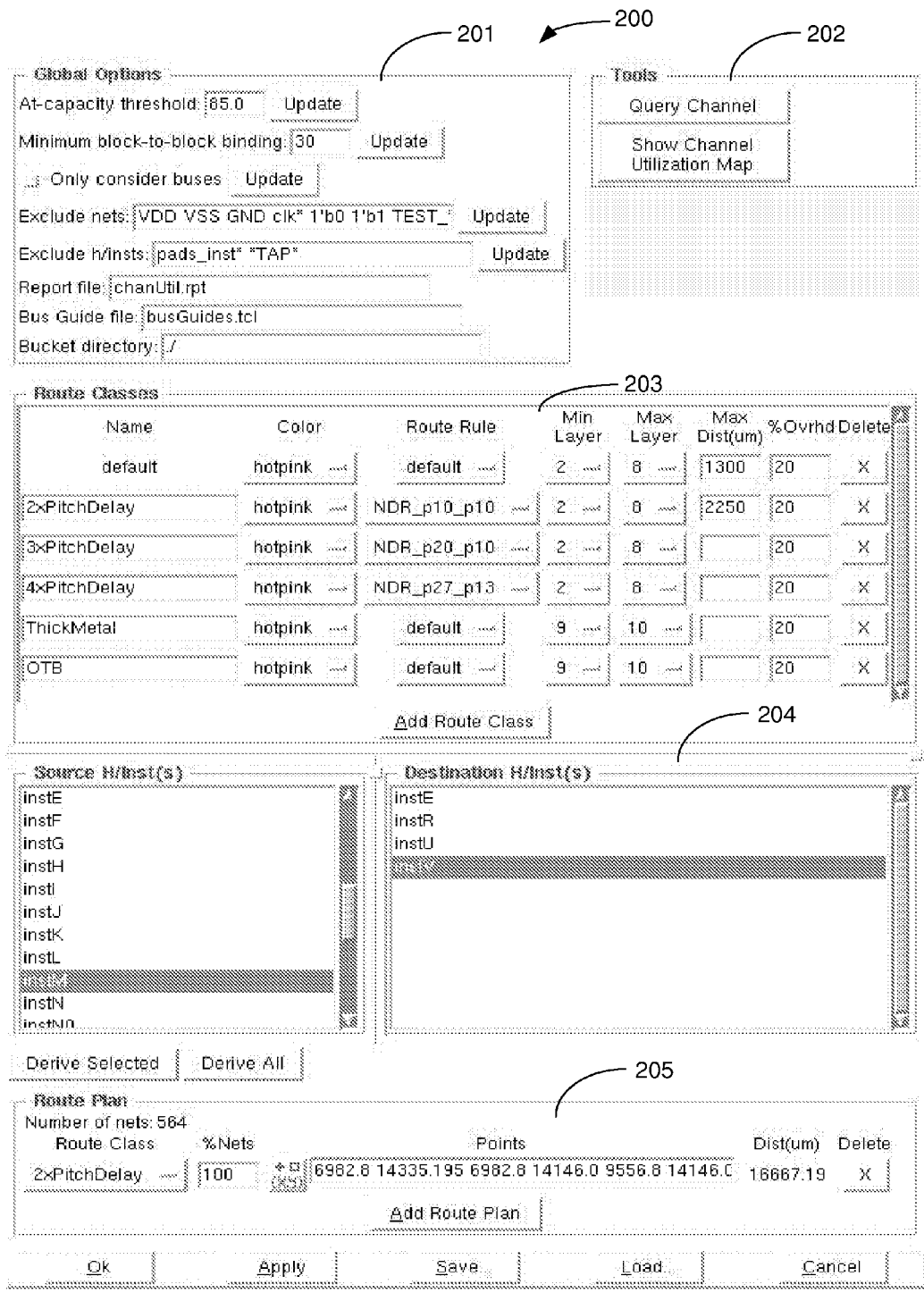
FIG. 5 illustrates a screen shot of a route planner screen of the GUI of the computer system shown in FIG. 3.
Figure 6:
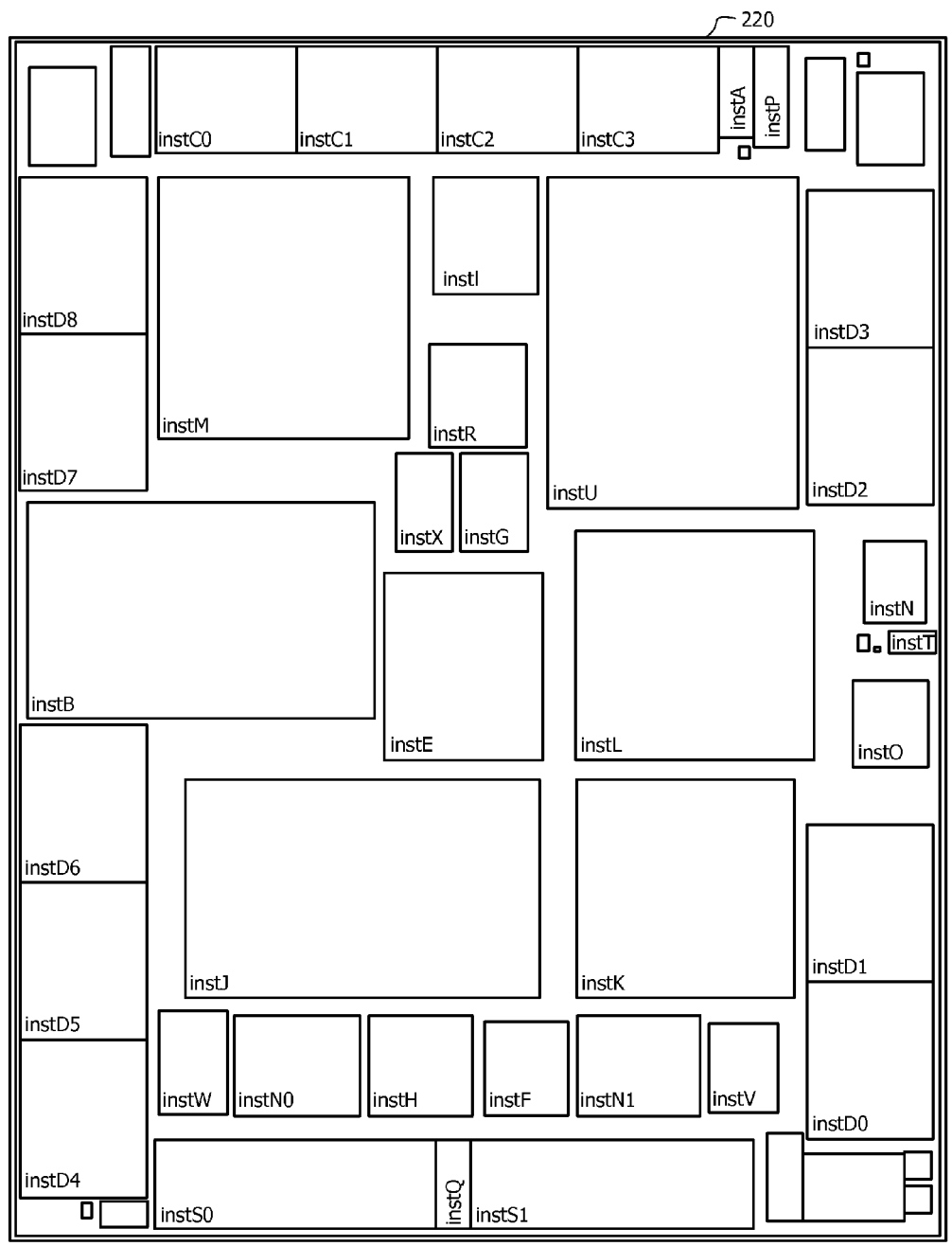
FIG. 6 illustrates an example of an unrouted floor plan that has been created using the computer system shown in FIG. 3.
Figure 12:
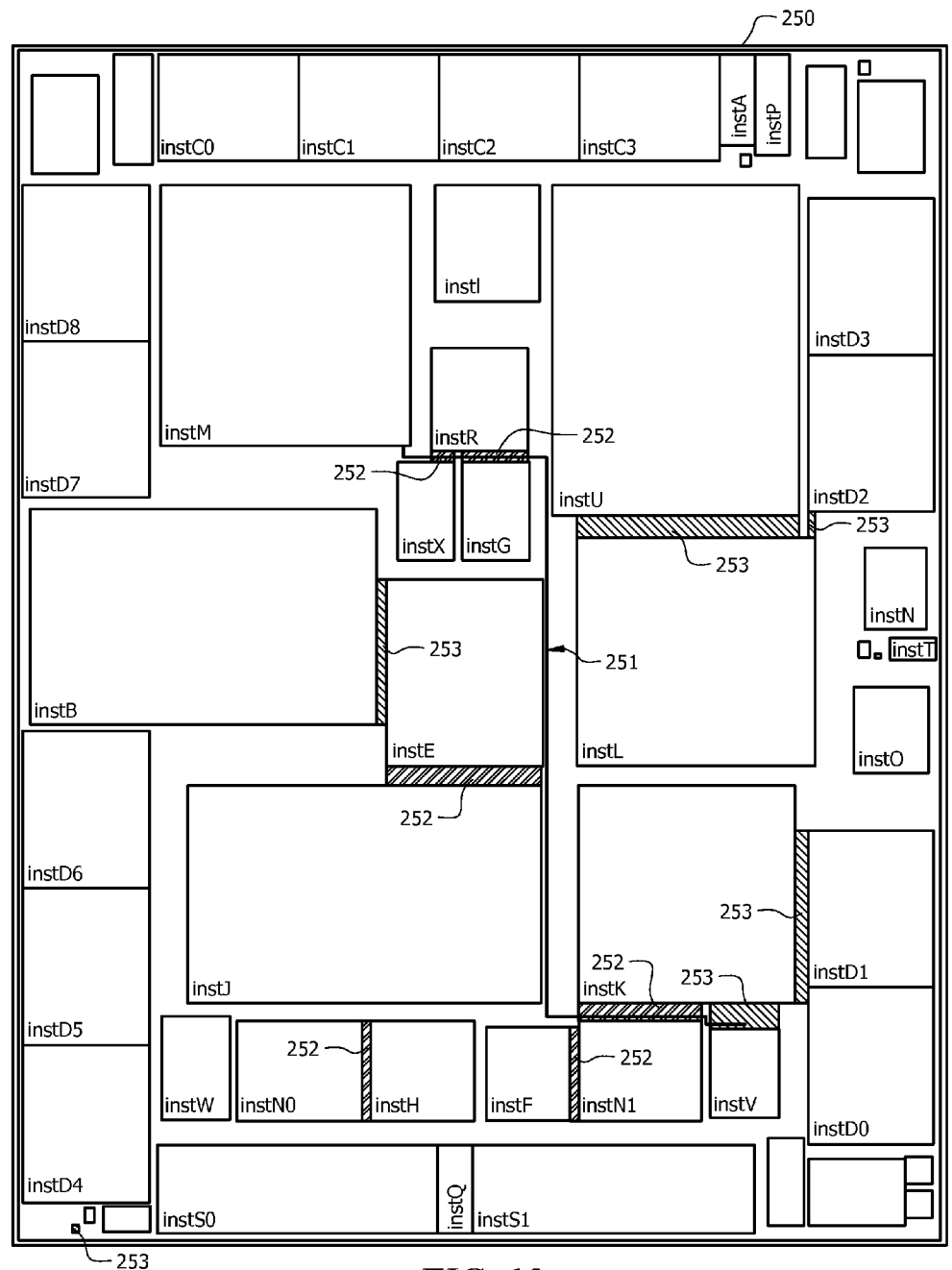
FIG. 12 illustrates a preliminary route-planned floor plan that has been created by using the route planner screen shown in FIG. 5.
Figure 13:
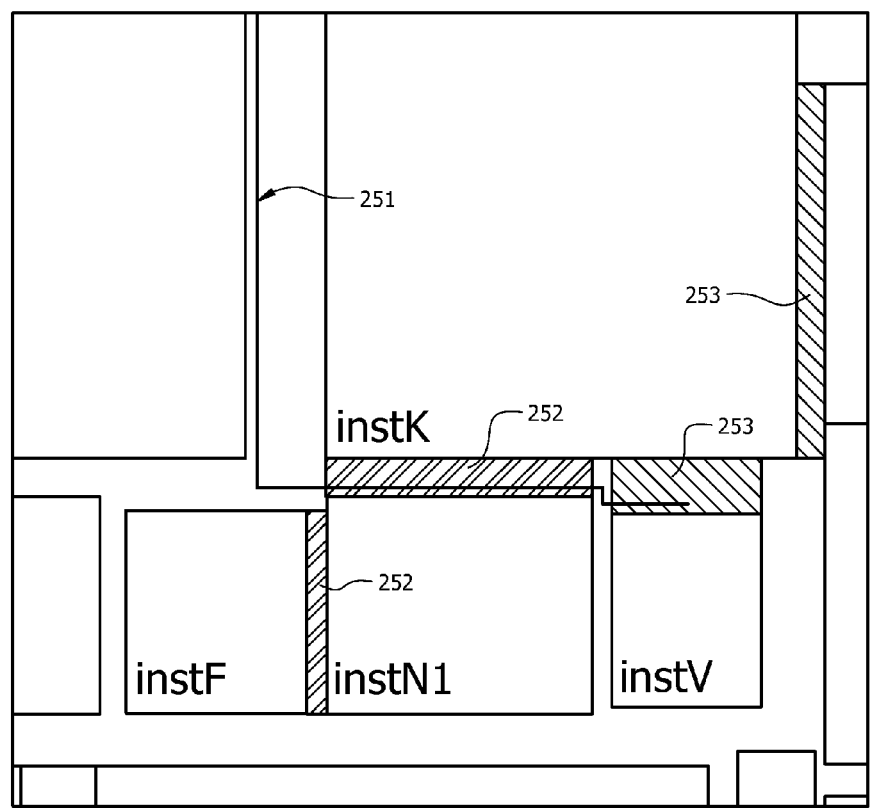
FIG. 13 illustrates an enlarged view of a portion of the preliminary routed floor plan shown in FIG. 12.
Figure 15:
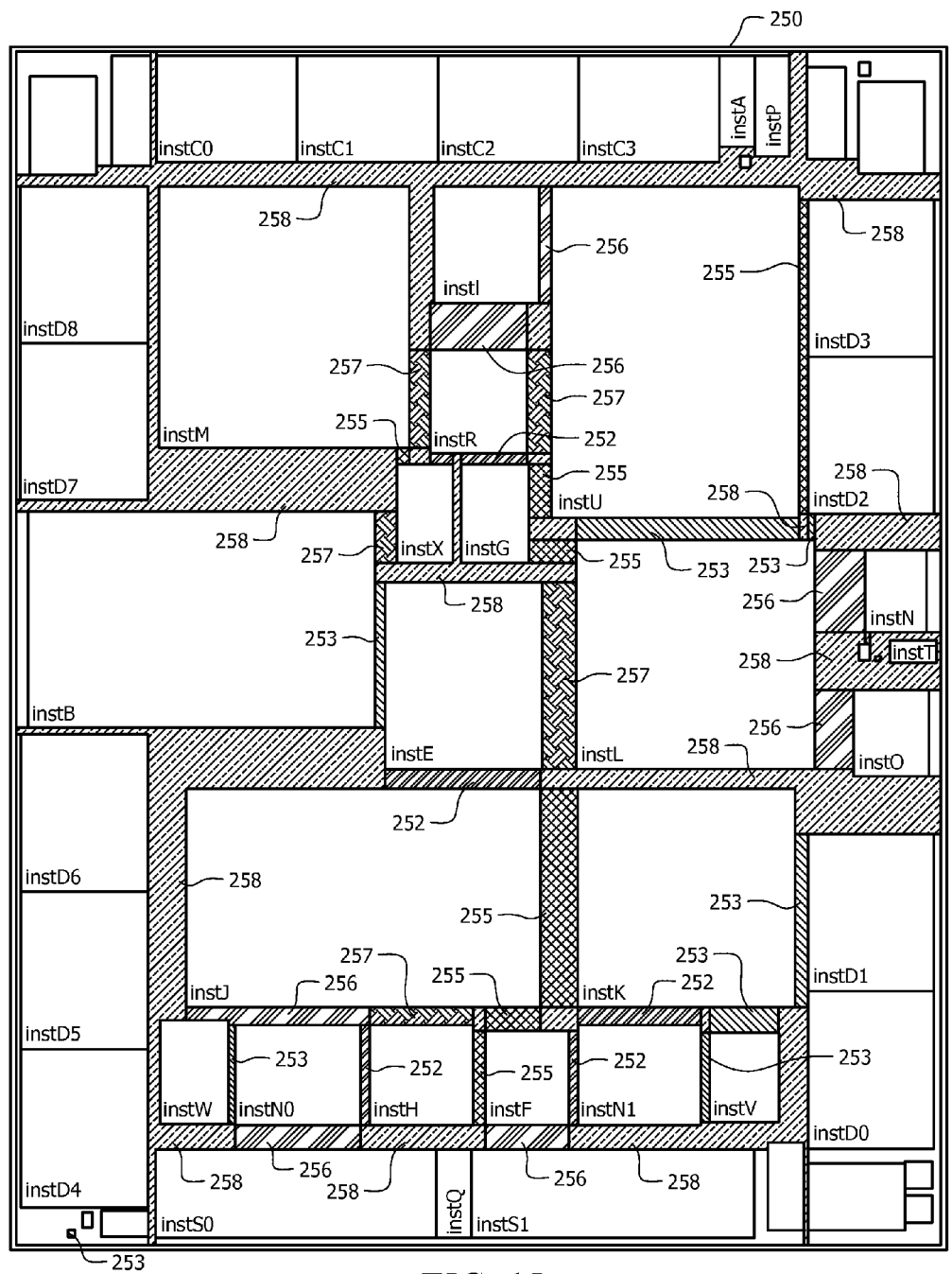
FIG. 15 illustrates the preliminary routed floor plan shown in FIG. 12 having a channel-utilization map that is created when the user makes an appropriate selection on the route planner screen shown in FIG. 5.
Figure 16:
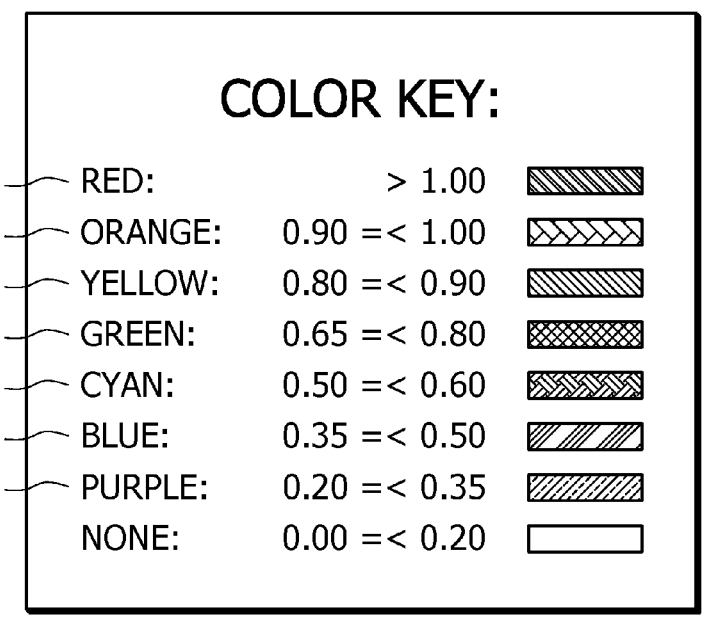
FIG. 16 illustrates a color key corresponding to the channel-utilization map shown in FIG. 15.

Various screen shots of the GUI and the manner in which a user interacts with them to design a preliminary routed floor plan will now be described. FIG. 5 illustrates a screen shot of a route planner screen 200 that the computer system 1 shown in FIG. 3 causes to be displayed on the display device 12 of the computer system 1. FIG. 6 illustrates an example of an unrouted floor plan 220 that has been created using known floor planning techniques. The unrouted floor plan 220 includes several blocks labeled "inst" followed by a letter or followed by a letter and a number. FIGS. 7-11 illustrate the various components of the route planner screen 200 shown in FIG. 5 and demonstrate the manner in which those components may be used to create and/or modify the floor plan 220 shown in FIG. 6. FIG. 12 illustrates a preliminary routed floor plan 250 that has been created by using the route planner screen 200 shown in FIG. 5. FIG. 13 illustrates an enlarged view of a portion of the preliminary routed floor plan 250 shown in FIG. 12. FIG. 14 illustrates a text report 260 that is displayed on the display device 12 when the user makes an appropriate selection on the route planner screen 220 shown in FIG. 5 and then selects a particular one of the channels shown in FIG. 13. FIG. 15 illustrates the preliminary routed floor plan 250 shown in FIG. 12 having a channel-utilization map that is created when the user makes an appropriate selection on the route planner screen 200 shown in FIG. 5. FIG. 16 illustrates the color key corresponding to the channel-utilization map shown in FIG. 15. The manner in which the route planner screen 200 is used will now be described with reference to FIGS. 3-16.

Preferably, the route planner screen 200 (FIG. 5) and the unrouted floor plan 220 (FIG. 6) are simultaneously displayed in separate windows on display device 12 (FIG. 3), although they may be displayed on separate display devices. Displaying them simultaneously allows the user to view the floor plan 220 as routes are created and/or modified. The algorithms represented by the flowchart shown in FIG. 4 are being executed by the computer system 1 shown in FIG. 3 as the user interacts with the route planner screen 200.

Figure 7:
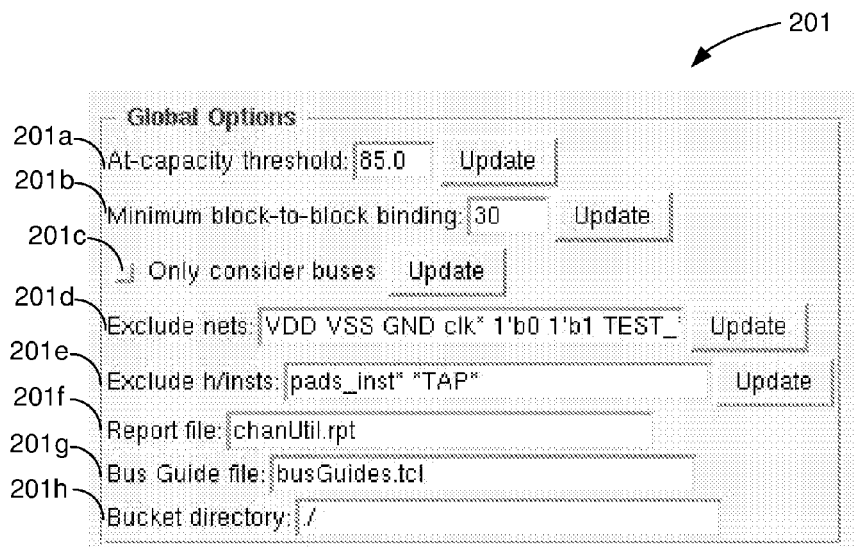

FIG. 7 illustrates the global options component 201 of the route planner screen 200 shown in FIG. 5. The global options component 201 includes features that allow the user to select which channels will be taken into consideration when designing the preliminary route plan of the floor plan. While all channels may be considered when designing the preliminary route plan, it is useful in many cases to be able to select particular channels or particular types of channels for consideration when designing the preliminary route plan of the floor plan. Thus, the user can select all channels for consideration or fewer than all channels for consideration when designing the preliminary route plan of the floor plan.

The global options component 201 has an at-capacity threshold field 201*a* into which the user inserts a numerical value that represents a percentage of the available resources of any given channel that are consumed before the channel will be considered to be at capacity. For exemplary purposes, the numerical value is shown to be 85, which means that when 85% of the resources of any channel have been used for routing, the channel will be highlighted in yellow to indicate that it is at capacity.

The global options component 201 has a minimum block-to-block binding field 201*b* into which the user inserts a numerical value that represents the number of routes that are needed between any two blocks before the routes of the corresponding channel will be displayed in the floor plan. For exemplary purposes, the numerical value is shown to be 30, which means that any block-to-block binding that contains fewer than 30 routes will not be accounted for in the route planner. This feature allows the user to select which block-to-block bindings will be included in the preliminary route plan of the floor plan. For example, block-to-block bindings that have a relatively small number of routes may be ignored during the floor planning stage to further reduce the time needed to use the route planner.

The global options component 201 has a button 201*c* that can be selected if the user desires only routes corresponding to buses to be shown in the preliminary route plan of the floor plan. This feature allows signals that are not declared as buses to be ignored during the floor planning stage.

The global options component 201 has a field 201*d* into which particular names of nets may be inserted to indicate that routes corresponding to those nets are to be excluded from the floor plan during the preliminary routing stage of the floor planning stage. This feature allows routes corresponding to certain nets, such as supply voltage routes and ground routes, to be ignored during the preliminary routing stage of the floor planning stage.

The global options component 201 has a field 201*e* into which names of particular blocks may be inserted to indicate that routes interconnecting those blocks are to be excluded from the floor plan. This feature allows routes corresponding to interconnections between certain blocks to be ignored during the floor planning stage.

The global options component 201 has fields 201*f,* 201*g* and 201*h* into which particular names of files or directories may be inserted to indicate locations where the results of all or part of the analysis shown in FIG. 4 are to be stored. This feature allows the user to generate reports that are useful to the user in deciding whether routes may be modified to better meet routing demands.

Figure 8:
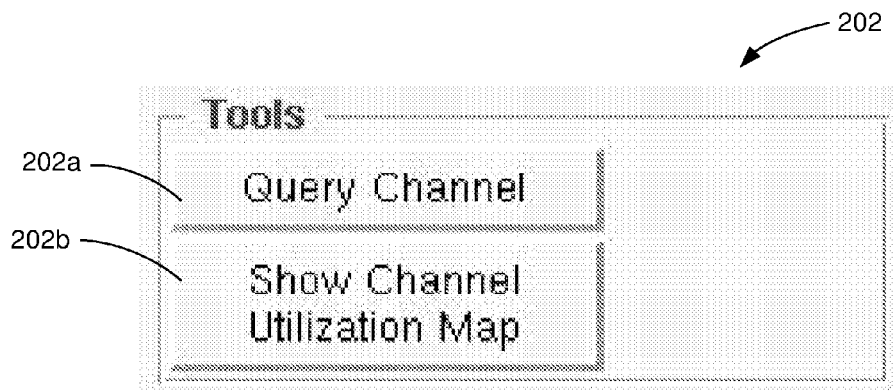

FIG. 8 illustrates the tools component 202 of the route planner screen 200 shown in FIG. 5. The tools component 202 has a Query Channel button 202*a* and a Show Channel Utilization Map button 202*b*. The Query Channel button 202*a* allows the user to cause a report to be generated for a selected channel, as will be described below in more detail with reference to FIGS. 13 and 14. The Show Channel Utilization Map button 202*b* allows the user to cause all of the channels in the preliminary routed floor plan to be highlighted in colors that indicate levels of resource usage of the channels, as will be described below in more detail with reference to FIG. 15.

FIG. 9 illustrates a route classes component 203 of the route planner screen 200 shown in FIG. 5. The route classes component 203 allows the user to define route classes and route rules corresponding to conductor configurations that need to be used for the routes in order to ensure that the propagation delays associated with signals propagating along the conductors of the routes will meet certain static timing constraints. The route classes component 203 includes route class name fields 203*a* into which the user inserts names that will be used to identify the different route classes. Each of these names corresponds to a particular conductor configuration that has been preselected based on its ability to ensure that signals propagating over particular distances over the conductors will meet static timing constraints. The colors 203*b* that will initially be used to highlight a particular route plan in the preliminary routed floor plan are preselected. In the example described herein, the color hot pink has been preselected as the color that will initially be used to highlight the specified route plan for a given block-to-block binding that uses the specified route class.

The conductor configurations that will be used for each route class are identified as route rules 203*c*. Each route rule 203*c* corresponds to a particular conductor configuration having a particular width, spacing and thickness. The metal layers of the IC design that may be used for each class of routes are preselected as Min Layer 203*d* and Max Layer 203*e*. The maximum distances that each of the conductor configurations of each route class can extend while still ensuring that the corresponding signals meet static timing constraints are entered into fields identified as Max Distance (µm) 203*f*. The expected route overhead for each route class is entered into fields identified as % Ovrhd 203*g*. Any route class can be removed by pressing the corresponding delete button 203*h*.

The default route class corresponds to the conductors having the minimum width, spacing and thickness values that are available for use as routes. The conductors of this class may use metal layers 2 through 8 in the IC design, although these min and max layers may differ depending on the manufacturing technology. The 2×PitchDelay route class name corresponds to a conductor configuration having a width and spacing roughly double to that of the default route class. The conductor configuration corresponding to this class may use metal layers 2 through 8 in the IC design, although these min and max layers may differ depending on the manufacturing technology. The 3×PitchDelay route class name corresponds to a conductor configuration having a width and spacing roughly triple to that of the default route class. The conductor configuration corresponding to this class may use metal layers 2 through 8 in the IC design, although these min and max layers may differ depending on the manufacturing technology. The 4×PitchDelay route class name corresponds to a conductor configuration having a width and spacing roughly quadruple to that of the default route class. The conductor configuration corresponding to this class may use metal layers 2 through 8 in the IC design, although these min and max layers may differ depending on the manufacturing technology. The ThickMetal class name corresponds to the thickest possible conductor configuration that can be used for routes. The conductor configuration corresponding to this class may use metal layers 9 and 10 in the IC design, although these min and max layers may differ depending on the manufacturing technology. The OTB route class name corresponds to a conductor configuration that is routed over the top of a block (OTB). The conductor configuration corresponding to this class may use metal layers 9 and 10 in the IC design, although the min and max layers can be adjusted depending on the design.

The invention is not limited to using any particular route classes or route rules, or to using any particular types of conductor configurations for the various route classes and route rules. The route classes and route rules that are used in designing ICs, as well as the corresponding conductor configurations, may differ among different IC designers and manufacturers. The route classes and rules and their corresponding conductor configurations shown in FIG. 5 are merely examples of suitable route classes, rules and conductor configurations. Likewise, the metal layers that are available for use for the different classes and rules are not limited to those that are shown in FIG. 5. Likewise, the max distances and overhead percentages for each route class are not limited to those that are shown in FIG. 5. Persons of skill in the art will understand that many modifications may be made to the route classes component 203 of the route planner screen 200 shown in FIG. 5.

Figure 10:
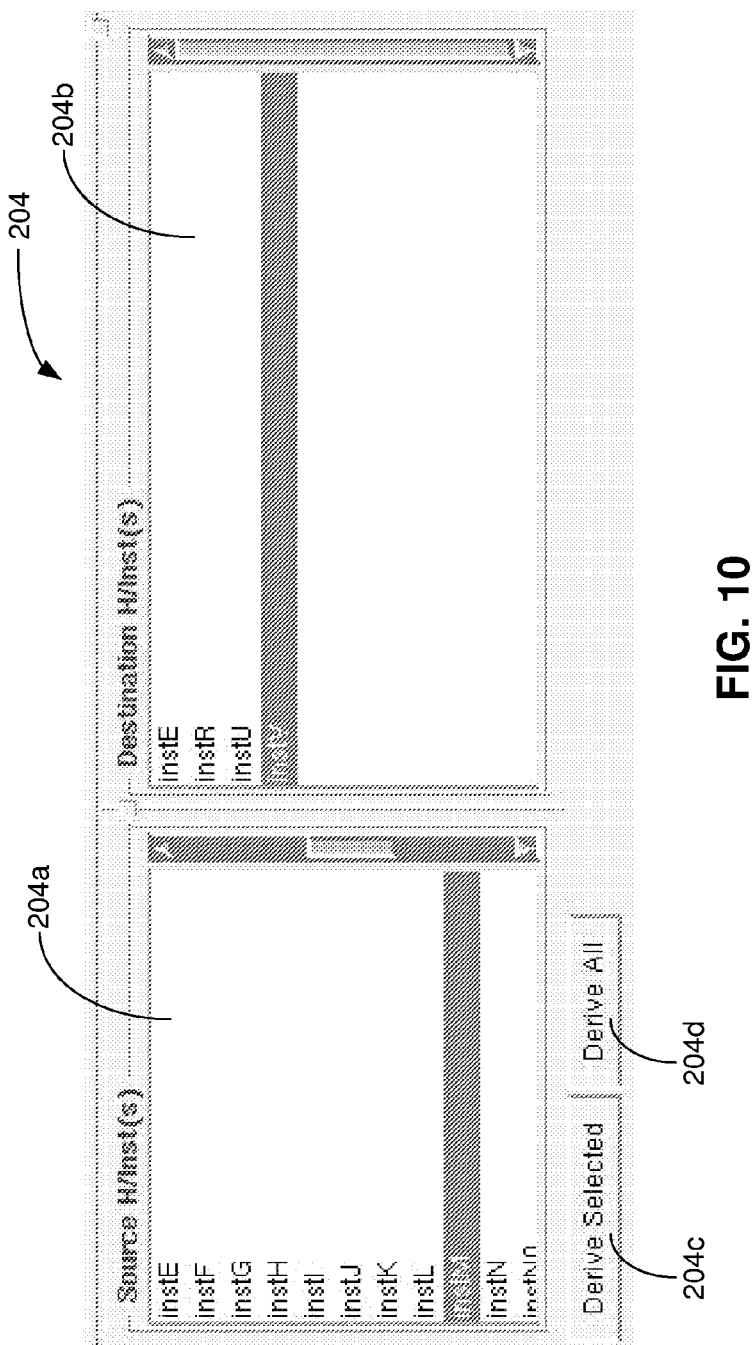

FIG. 10 illustrates a source-destination block component 204 of the route planner screen 200 shown in FIG. 5. The source-destination block component 204 displays source blocks in one window 204*a* and destination blocks in another window 204*b*, although it should be noted that source and destination do not indicate directionality of the route, but simply block-to-block bindings. If the user selects one of the source blocks displayed in window 204*a*, the computer system 1 (FIG. 3) causes all of the destination blocks that are to be electrically interconnected with the selected source block to be displayed in window 204*b*. In the example shown in FIGS. 5 and 10, source block instM has been selected by the user, thereby causing blocks instE, instR, instU, and instV to be displayed in window 204*b*. If the user then selects one of the destination blocks displayed in window 204*b* and clicks the Derive Selected button 204*c*, the computer system 1 (FIG. 3) will automatically derive the ideal path between the selected source and destination blocks. If the user clicks the Derive All button 204*d*, the computer system 1 (FIG. 3) will automatically derive the ideal paths between all of the source blocks and their associated destination blocks.

Figure 11:
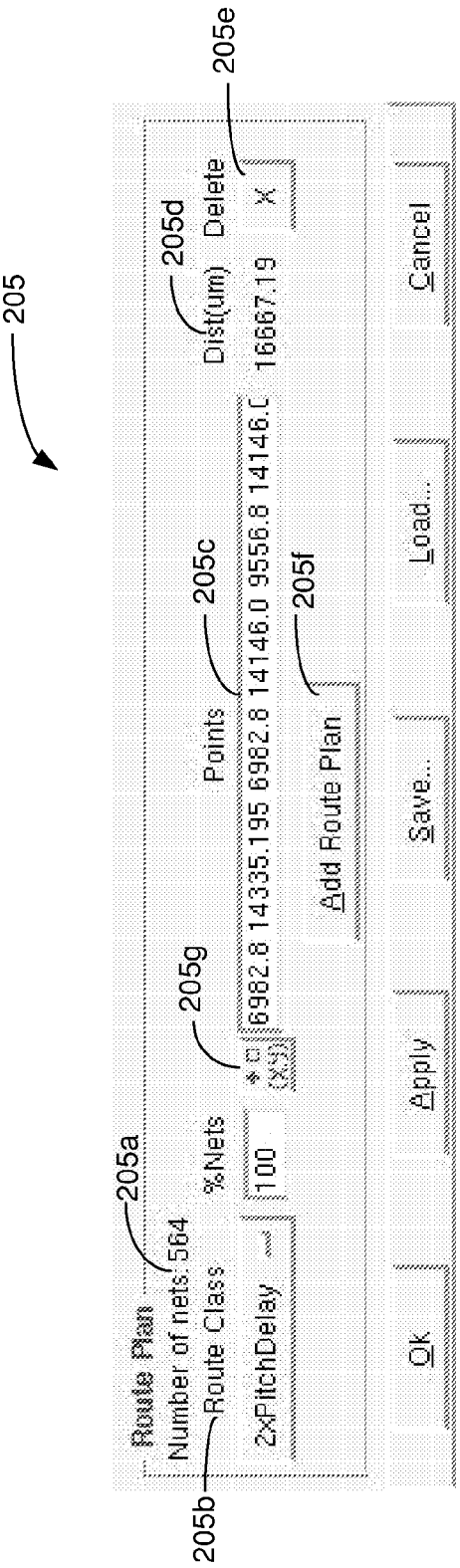

FIG. 11 illustrates a route plan component 205 of the route planner screen 200 shown in FIG. 5. The route plan component 205 displays certain information about the routes that interconnect the source and destination blocks selected in windows 204*a* and 204*b* of the source-destination component 204. In particular, the route plan component 205 displays the number of nets 205*a* corresponding to the planned route, the route class 205*b* corresponding to the planned route, the point-to-point coordinates 205*c* of the planned route, and the length 205*d* of the planned route (dist(μm)). The user can cause a previously-created route to be deleted by clicking on the Delete button 205*e*. After a previously-created route has been deleted, the user can replace the deleted route with a new route by performing the following sequence of steps: (1) clicking the Add Route Plan button 205*f*, (2) clicking the x,y button 205*g*, and clicking point-by-point in the floor plan 220 on the x, y locations over which the new route will extend.

When a preliminary routed floor plan is initially being created using the route planner screen 200, the user will typically use ideal paths for all of the routes. Once the user has added all of the planned ideal routes to the floor plan, the supply and demand analysis of all of the planned routes will automatically be displayed in the routed floor plan 250 shown in FIG. 12. As indicated above, routes that are at capacity are displayed in yellow and routes that are over-utilized are displayed in red. Routes that are under-utilized are displayed in green. In addition to using colors to convey information about resource usage in a channel, stipples are used to indicate the direction of the channel. The different colors are represented in the figures by different types of cross hatching.

FIG. 13 illustrates an enlarged view of a portion of the routed floor plan 250 shown in FIG. 12 that shows the route 251 that interconnects source block instM (FIG. 12) and destination block instV. In the portion of the channel that is disposed in between blocks instK and instN1, the demand for routing resources exceeds the supply of available routing resources, which is visually indicated by that portion of the channel being colored red. The color red is represented in the figures by cross hatching 252. Likewise, in the portion of the channel that is disposed between blocks instF and instN1, the demand for routing resources exceeds the supply of available routing resources, which is visually indicated by that portion of the channel being colored red. In the portion of the channel that is disposed in between blocks instK and instV, the supply of available routing resources is approximately equal to the demand for routing resources, which is visually indicated by that portion of the channel being yellow to indicate that it is at capacity. The color yellow is represented in the figures by cross hatching 253. Likewise, in the portion of the channel that is disposed in between blocks instK and instD1 (FIG. 12), the supply of available routing resources is approximately equal to the demand for routing resources, which is visually indicated by that portion of the channel being yellow 253.

The user can click the Query Channel button 202*a* (FIG. 8) and then click one of the routing channels in the GUI screen shown in FIG. 12 to cause a report such as the report 260 shown in FIG. 14 to be generated. In this example, the report 260 was caused to be generated by clicking the Query Channel button 202*a* and then clicking on the portion of the routing channel that is disposed in between blocks instK and instN1 in FIG. 13. The report 260 contains relevant information about this portion of the routing channel, such as the point-to-point coordinates of that portion of the channel, the extent to which that portion of the channel is over-utilized, the number of additional conductors that are needed in order to meet the current demand, the source and destination blocks of any nets that pass through that portion of the channel, the number of nets that are associated with each source block and its respective destination block, and the route class associated with each group of nets. For example, in FIG. 14, it can be seen that the portion of the channel that is disposed in between blocks instK and instN1 includes: 1212 nets for interconnecting blocks instF and instV; 601 nets for interconnecting blocks instE and instV; 564 nets for interconnecting blocks instM and instV; 400 nets for interconnecting blocks instD0 and instJ; and for 400 nets for interconnecting blocks instD1 and instJ.

By viewing the report 260, the user is able to easily determine which of the routes listed in the report 260 may be rerouted to reduce the burden on resources in this portion of the channel. For example, the user may decide that some or all of the 564 nets interconnecting blocks instM and instV should be rerouted in order to reduce congestion in this portion of the channel. In this case, with blocks instM and instV selected in windows 204a and 204b of screen 200 shown in FIGS. 5 and 10, the user selects the Delete button 205e (FIG. 11) to cause the corresponding routes to be deleted. The user then specifies the new route to be used. For example, if the user decides that the nets associated with the interconnections between blocks instM and instV should be routed below block instN1 instead of above it, the user would perform the following sequence of steps: (1) click the Add Route Plan button 205f (FIG. 11); (2) click the x, y button 205g (FIG. 11); and (3) place the cursor on points in the routed floor plan 250 (FIG. 12) from block instM to block instV over which the modified route will extend and clicking on those points. This will cause the corresponding point-to-point coordinates to populate field 205c (FIG. 11) and the GUI to automatically be updated with the new channel utilization information. It should be noted that when routes are modified in this manner, it may be necessary to modify the floor plan to change the locations of the input/output (I/O) pins on one or more blocks that connect to the nets.

FIG. 15 illustrates the routed floor plan 250 shown in FIG. 12 after the user has clicked on the Show Channel Utilization Map button 202b shown in FIG. 8. When the user takes this action, the preliminary routed floor plan 250 is overlayed with a channel-utilization map that visually conveys with colors the overall channel usage of the preliminary routed floor plan 250. The color key shown in FIG. 16 illustrates the colors that are used for the different levels of usage and the respective types of cross hatchings 252-258 that are used in FIG. 15 to represent the respective colors. Each of the colors corresponds to a range of the ratio, D/S, of the demand, D, on channel resources to the supply, S, of channel resources. If this ratio is greater than 1.00, then the channel is colored red 252 to indicate that it is over-utilized. If the ratio is greater than 0.90 and less than or equal to 1.00, then the channel is colored orange 254 to indicate that it is not yet over-utilized, but is close to being over-utilized. If the ratio is greater than 0.80 and less than or equal to 0.90, then the channel is colored yellow 253 to indicate that it is at capacity. If the ratio is greater than 0.65 and less than or equal to 0.80, then the channel is colored green 255 to indicate that it is under-utilized. If the ratio is greater than 0.50 and less than or equal to 0.65, then the channel is colored cyan 256 to indicate an even greater extent of under-utilization. If the ratio is greater than 0.35 and less than or equal to 0.50, then the channel is colored blue 257 to indicate an even greater extent of under-utilization. If the ratio is greater than 0.20 and less than or equal to 0.35, then the channel is colored purple 258 to indicate an even greater extent of under-utilization. If the ratio is greater than 0.00 and less than or equal to 0.20, then the channel is left uncolored to indicate that it is not being utilized.

The color-mapped preliminary routed floor plan shown in FIG. 15 and the color key shown in FIG. 16 typically are simultaneously displayed so that the user can easily discern the information that is being conveyed by the color mapping. By viewing them together, the user can easily see the extent of utilization of each of the channels. Based on this information, the user can easily determine which channels can be grown or shrunk to ensure that routing resources are being used effectively.

It can be seen from all of the above that the floor planning tool of the invention allows a user to easily create a preliminary routed floor plan, and if necessary, to easily modify the preliminary routed floor plan during the floor planning stage. In this way, fewer iterations are needed between the floor planning tool, the routing tool, the RC extraction tool, and the static timing analysis tool to arrive at the final routed floor plan. This significant reduction in the number of iterations that are required to design the IC results in a significant reduction in costs. In addition, because the final routed floor plan will have fewer meandering routes, die area is more efficiently used, which also results in cost reductions.

It should be noted that the invention has been described with reference to a few illustrative embodiments for the purpose of demonstrating the principles and concepts of the invention. Persons skilled in the art will understand, however, that the invention is not limited to the illustrative embodiments described herein, and that many variations may be made to the embodiments described herein without deviating from the principles and concepts of the invention. For example, the screen 200 shown in FIG. 5 may be modified in an almost infinite number of ways while still achieving the goals of the invention, and more or less functionality may be provided by the screen 200. Many variations may also be made to the processes represented by the flowchart shown in FIG. 4 while still achieving the goals of the invention. The computer system 1 shown in FIG. 3 may also take on a variety of forms. Also, while colors have been used to convey information in the illustrative embodiments, the same information could be visually conveyed in other ways, such as by using numbers. All such variations are within the scope of the invention, as will be understood by persons of skill in the art in view of the description provided herein.

What is claimed is:

1. A computer system for designing a floor plan of an integrated circuit (IC) design to includes a preliminary route plan, the computer system comprising:

a user interface;

a memory subsystem that stores a representation of at least a portion of the IC design and computer code for designing a floor plan; and a processor subsystem, the processor subsystem programmed to:

generate a floor plan having multiple blocks of logic and channels comprising portions of one or more layers of metal extending between the blocks;

determine a supply of routing resources that is available for one or more selected channels of the floor plan for routing electrical signals in the selected channels between the blocks;

generate a preliminary route plan in the floor plan for the selected channels based on the supply of available routing resources, the preliminary route plan comprising electrically-conductive routes, each selected channel including at least one of the routes;

determine a demand on routing resources for each respective selected channel based on the preliminary route plan;

determine whether or not the demand on routing resources for each respective selected channel exceeds the supply of routing resources for each respective selected channel; and a display system comprising at least one display device, wherein if the processor subsystem determines that the demand on routing resources for a respective selected channel exceeds the supply of routing resources for the respective selected channel, the computer system causes a visual indication of the excess demand to be displayed on the display system.

2. The computer system of claim 1, further comprising:

wherein if the processor subsystem determines that the preliminary route plan can be adjusted to accommodate excess demand, the processor subsystem uses input from a user to adjust a portion of the preliminary route plan corresponding to the routes of the respective selected channel.

3. The computer system of claim 1, further comprising:
wherein if the processor subsystem determines that the preliminary route plan cannot be adjusted to accommodate excess demand, the processor subsystem uses input from a user to adjust the floor plan and to generate a new preliminary route plan for the adjusted floor plan.

4. The computer system of claim 1, wherein the floor plan and the preliminary route plan are displayed simultaneously on the display system, and wherein the visual indication is a coloring of the routes of the respective selected channel in a first color.

5. The computer system of claim 4, further comprising:
wherein if the processor subsystem determines that the demand on routing resources for a respective selected channel does not exceed the supply of routing resources for the respective selected channel, the processor subsystem determines whether or not the respective selected channel is under-utilized or at capacity.

6. The computer system of claim 5, wherein if the processor subsystem determines that the respective selected channel is under-utilized, the computer system causes a visual indication that the respective selected channel is under-utilized to be displayed on the display system.

7. The computer system of claim 6, wherein the visual indication is a coloring of the routes of the under-utilized channel in a second color that is different from the first color.

8. The computer system of claim 7, wherein if the processor subsystem determines that the respective selected channel is under-utilized, the processor subsystem uses input from a user to adjust the floor plan and to generate a new preliminary route plan for the adjusted floor plan.

9. The computer system of claim 8, wherein if the processor subsystem determines that the respective selected channel is at capacity, the computer system causes a visual indication that the respective selected channel is at capacity to be displayed on the display system.

10. The computer system of claim 9, wherein the visual indication is a coloring of the routes of the at-capacity channel in a third color that is different from the first and second colors.

11. A method for using a computer system for designing a floor plan of an integrated circuit (IC) design to include a preliminary route plan, the method comprising:
in a memory subsystem of the computer system, storing a representation of at least a portion of the IC design and computer code for designing a floor plan; and
in a processor subsystem of the computer system:
generating a floor plan having multiple blocks of logic and channels comprising portions of one or more layers of metal extending between the blocks;
determining a supply of routing resources that is available for one or more selected channels for routing electrical signals in the channels between the blocks;
generating a preliminary route plan in the floor plan based on the supply of available routing resources for the selected channels, the preliminary route plan comprising electrically-conductive routes, each selected channel including at least one of the routes;
determining a demand on routing resources for each respective selected channel based on the preliminary route plan;
determining whether or not the demand on routing resources for each respective selected channel exceeds the supply of routing resources for each respective selected channel; and
displaying the floor plan and the preliminary route plan on a display system, the display system comprising at least one display device, and wherein if it is determined that the demand on routing resources for a respective selected channel exceeds the supply of routing resources for the respective selected channel, displaying a visual indication that the respective channel is over-utilized on the display system.

12. The method of claim 11, further comprising:
if the processor subsystem determines that the demand on routing resources for a respective selected channel exceeds the supply of routing resources for the respective channel, in the processor subsystem, using user input to determine whether or not the preliminary route plan can be adjusted to accommodate excess demand.

13. The method of claim 12, further comprising:
if the processor subsystem determines that the preliminary route plan can be adjusted to accommodate excess demand, in the processor subsystem, using user input to adjust a portion of the preliminary route plan corresponding to the routes of the respective selected channel.

14. The method of claim 13, further comprising:
if the processor subsystem determines that the preliminary route plan cannot be adjusted to accommodate excess demand, in the processor subsystem, using user input to adjust the floor plan and to generate a new preliminary route plan for the adjusted floor plan.

15. The method of claim 11, wherein the visual indication is a coloring of the routes of the respective channel in a first color.

16. The method of claim 11, further comprising:
if the processor subsystem determines that the demand on routing resources for a respective selected channel does not exceed the supply of routing resources for the respective selected channel, in the processor subsystem, determining whether or not the respective selected channel is under-utilized or at capacity.

17. The method of claim 16, further comprising:
if the processor subsystem determines that the respective selected channel is under-utilized, causing a visual indication that the respective selected channel is under-utilized to be displayed on the display system.

18. The method of claim 17, wherein the visual indication is a coloring of the routes of the under-utilized channel in a second color that is different from the first color.

19. The method of claim 18, wherein if the processor subsystem determines that the respective selected channel is under-utilized, in the processor subsystem, using user input to adjust the floor plan and to generate a new preliminary route plan for the adjusted floor plan.

20. The method of claim 18, wherein if the processor subsystem determines that the respective selected channel is at capacity, causing a visual indication that the respective channel is at capacity to be displayed on the display system.

21. The method of claim 20, wherein the visual indication is a coloring of the routes of the at-capacity channel in a third color that is different from the first and second colors.

22. A computer program for designing a floor plan of an integrated circuit (IC) design in a computer system to include a preliminary route plan, the computer program comprising computer instructions stored on a non-transitory computer-usable medium, the computer instructions comprising:

computer instructions for generating a floor plan having multiple blocks of logic and channels comprising portions of one or more layers of metal extending between the blocks;

computer instructions for determining a supply of routing resources that is available for one or more selected channels for routing electrical signals in the selected channels between the blocks;

computer instructions for generating a preliminary route plan in the floor plan based on the supply of available routing resources, the preliminary route plan comprising electrically-conductive routes, each selected channel including at least one of the routes;

computer instructions for determining a demand on routing resources for each respective selected channel based on the preliminary route plan;

computer instructions for determining whether or not the demand on routing resources for each respective selected channel exceeds the supply of routing resources for each respective selected channel;

computer instructions for displaying the floor plan and the preliminary route plan on a display system of the computer system, the display system comprising at least one display device; and computer instructions for displaying on the display system a visual indication that the respective channel is over-utilized if it is determined that the demand on routing resources for a respective selected channel exceeds the supply of routing resources for the respective selected channel.

23. The computer program of claim 22, further comprising:
computer instructions for using user input to adjust a portion of the preliminary route plan corresponding to the routes of the respective channel if it is determined that the preliminary route plan can be adjusted to accommodate excess demand.

24. The computer program of claim 22, further comprising:
computer instructions for using user input to adjust the floor plan and to generate a new preliminary route plan for the adjusted floor plan if it is determined that the preliminary route plan cannot be adjusted to accommodate excess demand.

25. The computer program of claim 22, wherein the visual indication is a coloring of the routes of the respective selected channel in a first color.

26. The computer program of claim 25, further comprising:
computer instructions for determining whether or not the respective selected channel is under-utilized or at capacity if it is determined that the demand on routing resources for a respective channel does not exceed the supply of routing resources for the respective selected channel.

27. The computer program of claim 26, further comprising:
computer instructions for causing a visual indication that the respective selected channel is under-utilized to be displayed on the display system if it is determined that the respective selected channel is under-utilized.

28. The computer program of claim 27, wherein the visual indication that the respective selected channel is under-utilized is a coloring of the routes of the under-utilized channel in second color that is different from the first color.

29. The computer program of claim 28, further comprising:
computer instructions for adjusting the floor plan based on user input and generating a new preliminary route plan for the adjusted floor plan if it is determined that the respective selected channel is under-utilized.

30. The computer program of claim 29, further comprising:
computer instructions for causing a visual indication that the respective selected channel is at capacity to be displayed on the display system if it is determined that the respective selected channel is at capacity.

31. The computer program of claim 30, wherein the visual indication is a coloring of the routes of the at-capacity channel in a third color that is different from the first and second colors.

* * * * *